(12) United States Patent
Na

(10) Patent No.: US 10,553,355 B2
(45) Date of Patent: Feb. 4, 2020

(54) ELECTRONIC COMPONENT, BOARD HAVING THE SAME, AND METHOD OF MANUFACTURING METAL FRAME

(71) Applicant: SAMSUNG ELECTRO-MECHANICS CO., LTD., Suwon-si, Gyeonggi-do (KR)

(72) Inventor: Jae Young Na, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/724,047

(22) Filed: Oct. 3, 2017

(65) Prior Publication Data
US 2018/0268996 A1  Sep. 20, 2018

(30) Foreign Application Priority Data
Mar. 20, 2017  (KR) .................. 10-2017-0034739

(51) Int. Cl.
*H01G 4/01* (2006.01)
*H01G 2/06* (2006.01)
(Continued)

(52) U.S. Cl.
CPC ............... *H01G 4/01* (2013.01); *H01G 2/06* (2013.01); *H01G 4/232* (2013.01); *H01G 4/30* (2013.01);
(Continued)

(58) Field of Classification Search
CPC ............ H01G 4/30; H01G 2/06; H01G 4/232; H01G 4/012; H05K 3/3426; H05K 1/181
(Continued)

(56) References Cited

U.S. PATENT DOCUMENTS 6,046,902 A * 4/2000 Nakagawa .......... H01G 4/228
361/306.1
6,191,933 B1 * 2/2001 Ishigaki ................. H01G 4/232
361/309
(Continued)

FOREIGN PATENT DOCUMENTS

CN  1450574 A  10/2003
CN  101599365 A  12/2009
(Continued)

OTHER PUBLICATIONS

Office Action issued in Chinese Application No. 201711247916.7 dated Jul. 23, 2019, with English translation.

*Primary Examiner* — Michael P McFadden
(74) *Attorney, Agent, or Firm* — Morgan, Lewis & Bockius LLP

(57) ABSTRACT

An electronic component, a board having the same, and a method of manufacturing a metal frame for the electronic component. The electronic component includes a multilayer ceramic capacitor including a plurality of external electrodes formed on opposing surfaces of a capacitor body, respectively; and metal frames bonded to the external electrodes, respectively, wherein each of the metal frames includes an inner support portion, an outer support portion disposed on an outer surface of the inner support portion, and a connecting portion connecting portions of the inner support portion and the outer support portion to each other.

16 Claims, 13 Drawing Sheets

(51) Int. Cl.
  *H01G 4/232* (2006.01)
  *H01G 4/30* (2006.01)
  *H05K 3/34* (2006.01)
  *H05K 1/18* (2006.01)

(52) U.S. Cl.
  CPC ........... *H05K 1/181* (2013.01); *H05K 3/3442* (2013.01); *H05K 2201/10015* (2013.01); *H05K 2201/10946* (2013.01); *H05K 2201/2045* (2013.01)

(58) Field of Classification Search
  USPC .......................................... 361/308.1, 321.1
  See application file for complete search history.

(56) References Cited

U.S. PATENT DOCUMENTS

| | | | |
|---|---|---|---|
| 7,331,799 B1 * | 2/2008 | Lee ...................... | H01G 2/06 361/306.3 |
| 2003/0189817 A1 | 10/2003 | Yoshii et al. | |
| 2009/0296311 A1 | 12/2009 | Otsuka et al. | |
| 2014/0055910 A1 | 2/2014 | Masuda et al. | |
| 2015/0054388 A1 * | 2/2015 | Itagaki ................ | H01C 7/008 310/364 |
| 2016/0086734 A1 | 3/2016 | Park et al. | |
| 2016/0212843 A1 | 7/2016 | Park et al. | |

FOREIGN PATENT DOCUMENTS

| | | |
|---|---|---|
| CN | 103632844 A | 3/2014 |
| CN | 104425126 A | 3/2015 |
| KR | 10-2016-0035490 A | 3/2016 |
| KR | 10-2016-0089738 A | 7/2016 |

* cited by examiner

ELECTRONIC COMPONENT, BOARD HAVING THE SAME, AND METHOD OF MANUFACTURING METAL FRAME

CROSS-REFERENCE TO RELATED APPLICATION(S)

This application claims benefit of priority to Korean Patent Application No. 10-2017-0034739 filed on Mar. 20, 2017 in the Korean Intellectual Property Office, the disclosure of which is incorporated herein by reference in its entirety.

BACKGROUND

1. Field

The present disclosure relates to an electronic component, a board having the same, and a method of manufacturing a metal frame.

2. Description of Related Art

Examples of electronic components using a ceramic material include a capacitor, an inductor, a piezoelectric element, a varistor, a thermistor, or the like.

Among these ceramic electronic components, a multilayer ceramic capacitor (MLCC) may be used in various electronic apparatuses since it is relatively small, implements high capacitance, and is easily mounted.

For example, the multilayer ceramic capacitor is a chip type condenser mounted on the boards of various types of electronic product such as an image display device, for example, liquid crystal display (LCD), a plasma display panel (PDP), organic light emitting diode (OLED) display or the like, a computer, a personal digital assistant (PDA), a cellular phone and the like, to serve to charge or discharge electricity therein or therefrom.

The multilayer ceramic capacitor may have a structure in which a plurality of dielectric layers, and internal electrodes having different polarities and alternately disposed between the dielectric layers, are stacked.

Here, since the dielectric layers have piezoelectric properties, when direct current (DC) or alternating current (AC) voltages are applied to the multilayer ceramic capacitor, a piezoelectric phenomenon may occur between the internal electrodes to generate periodic vibrations while expanding and contracting a volume of a ceramic body depending on a frequency.

These vibrations may be transferred to a board through external electrodes of the multilayer ceramic capacitor and solders connecting the external electrodes and the board to each other, such that the entirety of the board becomes a sound reflecting surface to generate vibration sound, which is noise.

The vibration sound may correspond to an audio frequency in a range of 20 to 20,000 Hz making persons uncomfortable. The vibration sound making persons uncomfortable as described above is known as acoustic noise.

Further, in a recent electronic device, mechanical components have become silent, such that the acoustic noise generated in the multilayer ceramic capacitor as described above may be more prominent.

In a case in which the device is operated in a silent environment, a user may consider the acoustic noise as strange sound to decide that a fault has occurred in the device.

In addition, in a device having an audio circuit, the acoustic noise overlaps an audio output, such that quality of the device may be deteriorated.

In addition, when stress generated in the multilayer ceramic capacitor mounted on the board at the time the warpage of the board is not solved, a crack may be generated in the multilayer ceramic capacitor or the solders. Such a crack may deteriorate electrical characteristics of the multilayer ceramic capacitor or cause a problem in which the multilayer ceramic capacitor is separated from the board.

In order to prevent the acoustic noise and the warpage, a technology of attaching a metal frame to the external electrode of the multilayer ceramic capacitor to absorb the stress has been disclosed. However, in a structure of the metal frame according to the related art, a deviation for a stress absorbing effect and an acoustic noise reducing effect is increased depending on an amount and a shape of the solders.

SUMMARY

An aspect of the present disclosure may provide an electronic component, a board having the same, and a method of manufacturing a metal frame capable of reducing acoustic noise and warpage without deviations, regardless of an amount and a shape of solders.

According to an aspect of the present disclosure, an electronic component may include: a multilayer ceramic capacitor including a plurality of external electrodes formed on opposing surfaces of a capacitor body, respectively; and metal frames bonded to the external electrodes, respectively, wherein each of the metal frames includes an inner support portion, an outer support portion disposed on an outer surface of the inner support portion, and a connecting portion connecting portions of the inner support portion and the outer support portion to each other.

In the metal frame, the connecting portion may be disposed to connect one ends of the inner support portion and the outer support portion relatively distant from the multilayer ceramic capacitor to each other.

In the metal frame, the inner support portion and the outer support portion may be disposed to be spaced apart from each other.

In the metal frame, the inner support portion and the outer support portion may be disposed to be closely adhered to each other.

In the metal frame, an inner surface of an upper portion of the inner support portion may be attached to the external electrode, and an outer surface of a lower portion of the outer support portion may be a mounting surface.

A lower end of the multilayer ceramic capacitor may be disposed to be spaced apart from a lower end of the metal frame.

The electronic component may further include conductive adhesive layers disposed between the external electrodes and the metal frames.

The multilayer ceramic capacitor may include dielectric layers and a plurality of internal electrodes alternately disposed with respective dielectric layers interposed therebetween.

According to another aspect of the present disclosure, a board having an electronic component may include: a circuit board having a plurality of electrode pads disposed thereon; and the electronic component as described above mounted on the circuit board so that the metal frames are bonded to the electrode pads, respectively.

According to another aspect of the present disclosure, a method of manufacturing a metal frame bonded to an external electrode of a multilayer ceramic capacitor may include: preparing a sheet having a flat surface and a linear shape; folding the sheet; and folding the sheet folded in half in an L shape. In another embodiment, the sheet is folded in half; and a top portion of the folded sheet is folded in an inverted L shape, forming the metal frame having a C shape.

Another aspect of the present disclosure may provide an electronic component comprising: a multilayer ceramic capacitor including a plurality of external electrodes formed on opposing surfaces of a capacitor body, respectively; and metal frames bonded to the external electrodes, respectively, wherein each of the metal frames includes an inner support portion, an outer support portion being shorter than an inner support portion, separating from and overlapping an outer surface of the inner support portion, and a connecting portion connecting the inner support portion and the outer support portion. The metal frame has a "C" shape.

The inner support portion has a C shape and the outer support portion has an L shape. An end portion of a horizontal portion of the inner support portion and an end portion of a horizontal portion of the outer support portion are connected to both ends of the connecting portion, respectively.

In another aspect of the present disclosure, a board having an electronic component, comprising: a circuit board having a plurality of electrode pads disposed thereon; and the electronic component as described above mounted on the circuit board so that the metal frames are bonded to the electrode pads, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Electronic Component

Figure 1:
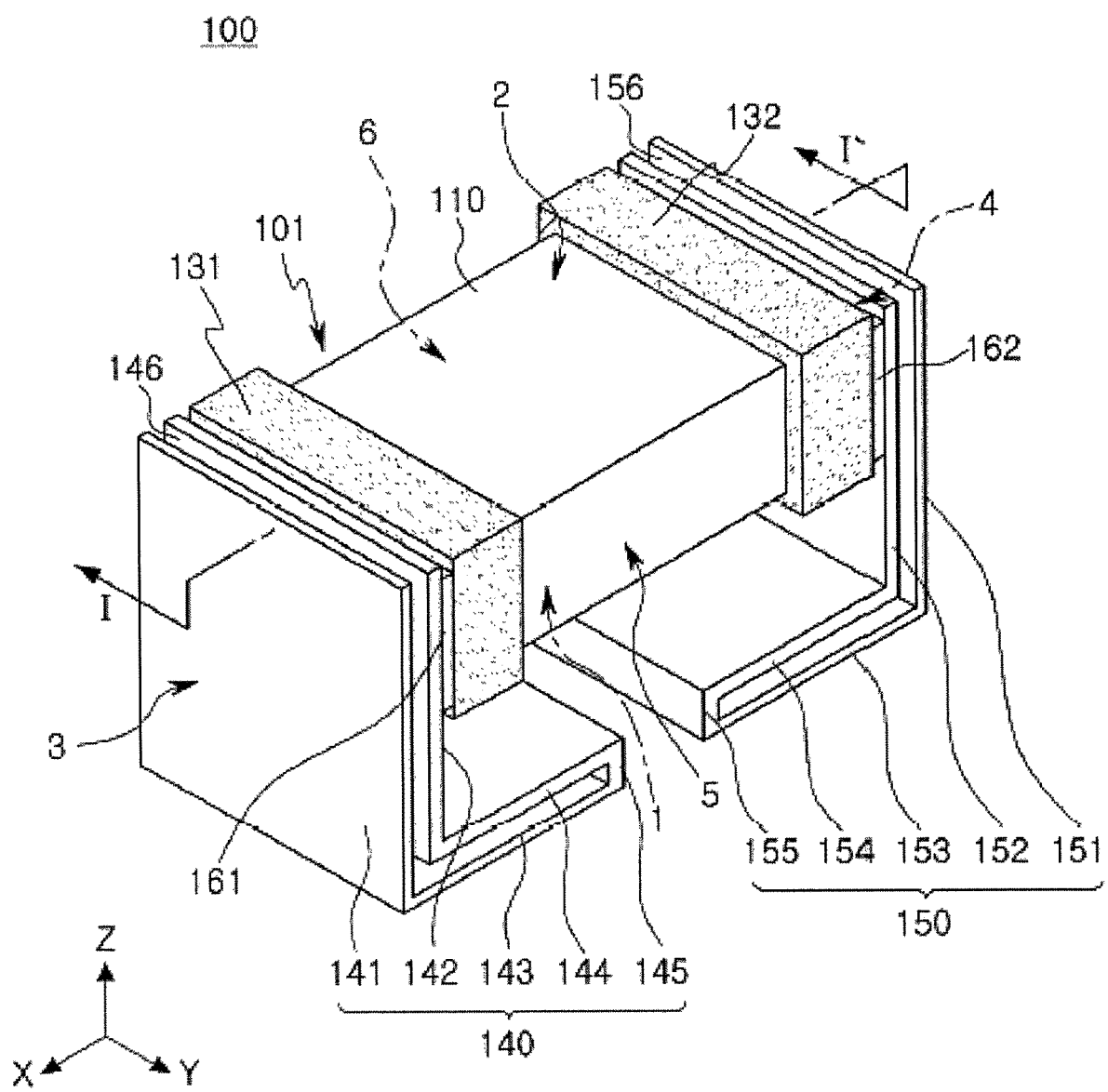
FIG. 1 shows a schematic perspective view illustrating an electronic component according to an exemplary embodiment in the present disclosure.
Figure 2:
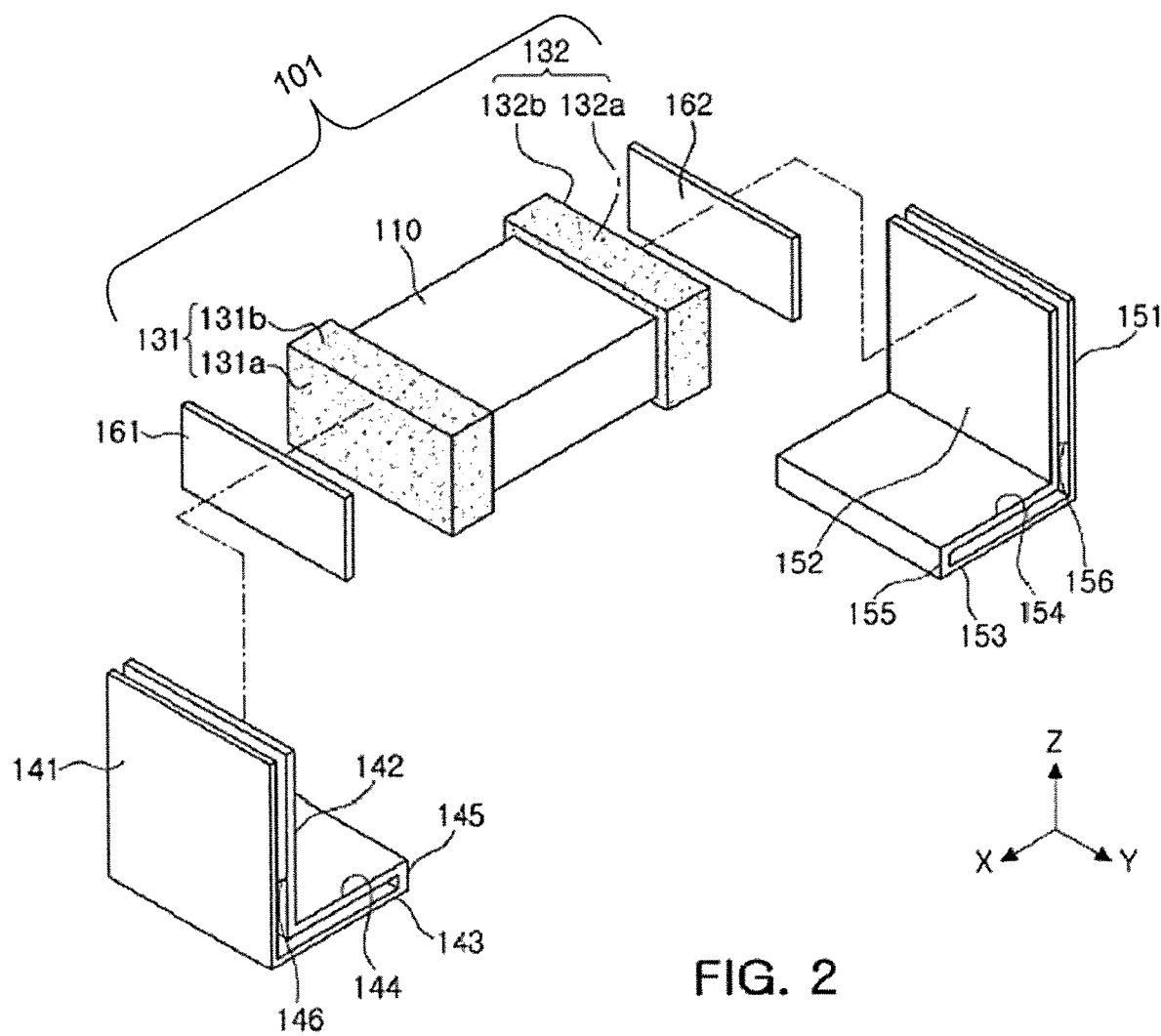
FIG. 2 shows an exploded perspective view of the electronic component of FIG. 1.
Figure 3:
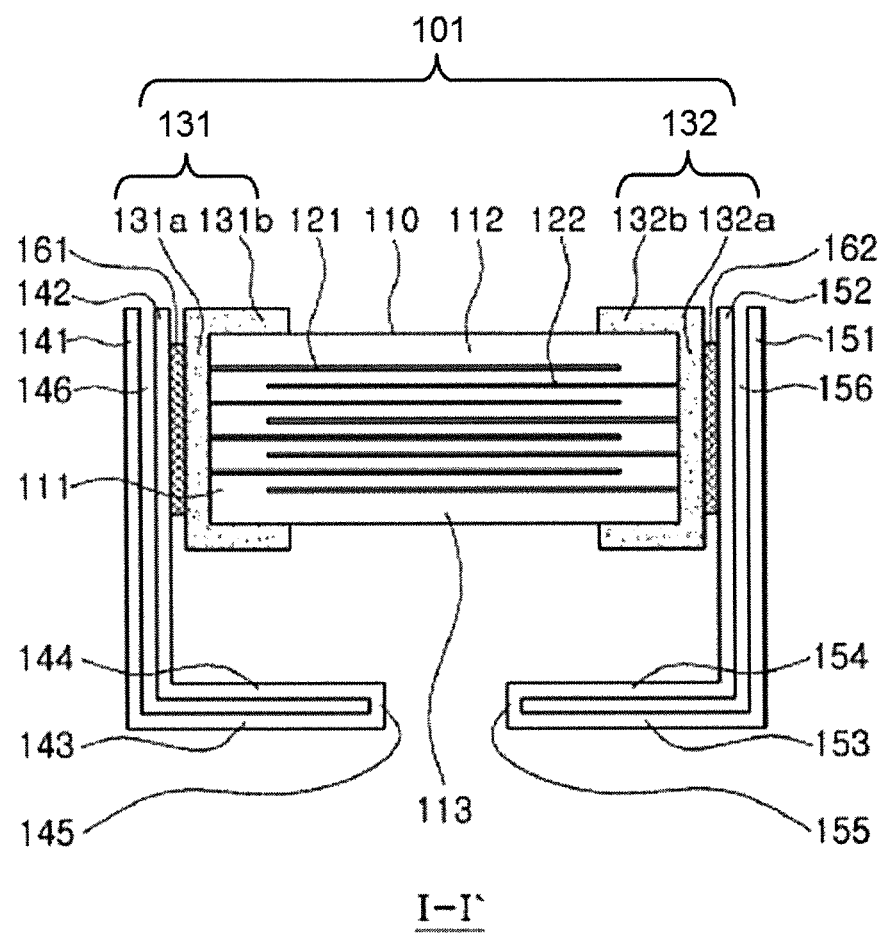
FIG. 3 shows a cross-sectional view taken along line I-I' of FIG. 1.
Figure 4:
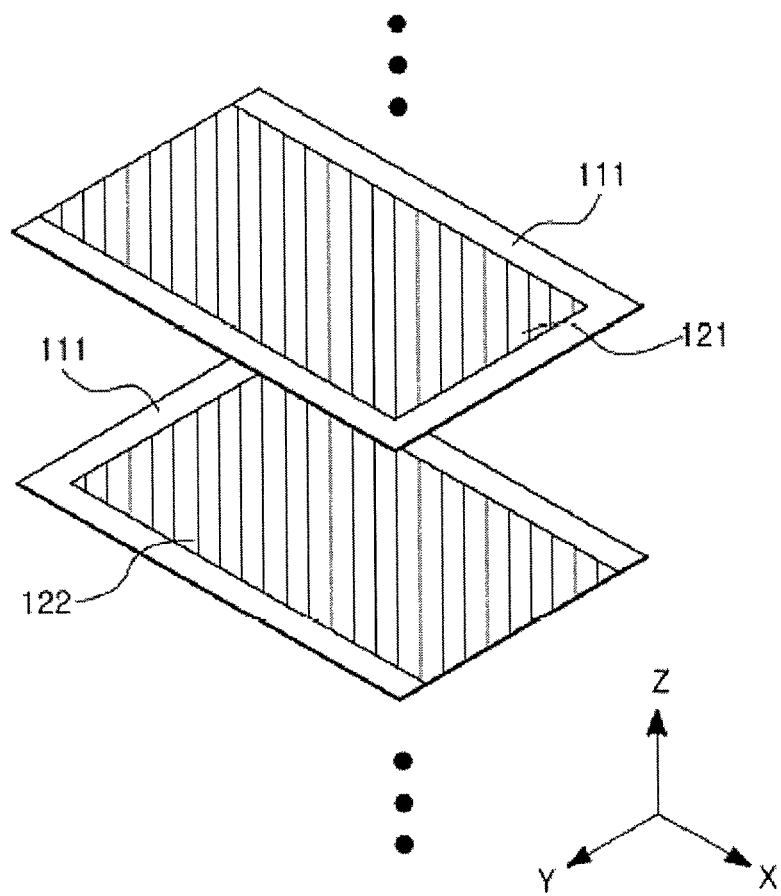
FIG. 4 shows a schematic exploded perspective view illustrating structures of internal electrodes of a multilayer ceramic capacitor in the electronic component according to an exemplary embodiment in the present disclosure.

FIG. 1 shows a schematic perspective view illustrating an electronic component according to an exemplary embodiment in the present disclosure, FIG. 2 is an exploded perspective view of the electronic component of FIG. 1, FIG. 3 is a cross-sectional view taken along line I-I' of FIG. 1, and FIG. 4 is a schematic exploded perspective view illustrating structures of internal electrodes of a multilayer ceramic capacitor in the electronic component according to an exemplary embodiment in the present disclosure.

Directions will be defined in order to clearly describe exemplary embodiments in the present disclosure. X, Y and Z in the drawings refer to a length direction, a width direction, and a thickness direction of a capacitor body, respectively. Here, the thickness direction refers to a stacked direction in which dielectric layers are stacked.

Referring to FIGS. 1, 2, 3 and 4, an electronic component 100 according to the present exemplary embodiment may include a multilayer ceramic capacitor 101 and first and second metal frames 140 and 150.

The multilayer ceramic capacitor 101 according to the present exemplary embodiment may include a capacitor body 110 and first and second external electrodes 131 and 132 on opposite surfaces of the capacitor body 110 opposing each other, respectively.

The capacitor body 110 may include a plurality of dielectric layers 111 and a plurality of first and second internal electrodes 121 and 122 alternately disposed with respective dielectric layers 111 interposed therebetween.

Here, the respective adjacent dielectric layers 111 of the capacitor body 110 may be integrated with each other so that boundaries therebetween are not readily apparent.

In addition, the capacitor body 110 may have a hexahedral shape (now shown). However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the thickness T direction in which the dielectric layers 111 are stacked, third and fourth surfaces 3 and 4 of the capacitor body 110 refer to opposite surfaces of the capacitor body 110 connecting the first and second surfaces 1 and 2 to each other and opposing each other in the X direction, and fifth and sixth surfaces 5 and 6 of the capacitor body 110 refer to opposite surfaces of the capacitor body 110 connecting the first and second surfaces 1 and 2 to each other, connecting the third and fourth surfaces 3 and 4 to each other, and opposing each other in the Y direction.

In addition, the capacitor body 110 may have an upper cover 112 formed at a predetermined thickness on a first or second internal electrode positioned at the uppermost portion of the capacitor body in the Z direction and a lower cover 113 disposed beneath a first or second internal electrode positioned at the lowermost portion of the capacitor body in the Z direction.

Here, the upper cover 112 and the lower cover 113 may be formed of the same composition as that of the dielectric layer 111 and be formed by stacking one or more dielectric layers that do not include internal electrodes on the uppermost internal electrode 121 of the capacitor body 110 and beneath the lowermost internal electrode 122 of the capacitor body 110, respectively.

The dielectric layer 111 may include a ceramic material having a high dielectric constant, for example, a barium titanate ($BaTiO_3$) perovskite-based ceramic powder, binary component ceramic powder, organic or polymeric materials, or the like. However, a material of the dielectric layer 111 is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which calcium (Ca), zirconium (Zr), or the like, is partially dissolved in $BaTiO_3$. However, an example of the barium titanate ($BaTiO_3$) based ceramic powder is not limited thereto.

In addition, the dielectric layer 111 may further include one or more of a ceramic additive, an organic solvent, a plasticizer, a binder, and a dispersant, if necessary.

For example, a transition metal oxide or carbide, a rare earth element, magnesium (Mg), aluminum (Al), or the like, may be used as the ceramic additive.

The first and second internal electrodes 121 and 122 may be formed on ceramic sheets forming the dielectric layers 111, stacked in the thickness direction, and then sintered, such that they are alternately disposed in the capacitor body 110 in the Z direction with respective dielectric layers 111 interposed therebetween.

The first and second internal electrodes 121 and 122, which have different polarities, may be disposed to face each other in the direction in which the dielectric layers 111 are stacked, and may be electrically insulated from each other by respective dielectric layers 111 disposed therebetween.

One end portions of the first and second internal electrodes 121 and 122 may be exposed through the third and fourth surfaces 3 and 4 of the capacitor body 110, respectively.

The end portions of the first and second internal electrodes 121 and 122 exposed through the third and fourth surfaces 3 and 4 of the capacitor body 110 may be electrically connected to the first and second external electrodes 131 and 132 on the third and fourth surfaces 3 and 4 of the capacitor body 110, respectively.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when a predetermined voltage is applied to the first and second external electrodes 131 and 132, electric charges may be accumulated between the first and second internal electrodes 121 and 122 facing each other. In this case, capacitance of the multilayer ceramic capacitor 101 may be in proportion to an area of a region in which the first and second internal electrodes 121 and 122 overlap each other in the direction in which the dielectric layers 111 are stacked.

The first and second external electrodes 131 and 132 may be disposed on both end portions of the capacitor body 110 in the X direction, respectively.

In addition, the first and second external electrodes 131 and 132 may include first and second connected portions 131a and 132a and first and second band portions 131b and 132b, respectively, connecting to the first and second connected portions 131a and 132a.

The first and second connected portions 131a and 132a may be disposed on the third and fourth surfaces 3 and 4 of the capacitor body 110, respectively, and may be connected to the exposed end portions of the first and second internal electrodes 121 and 122, respectively, to electrically connect the internal electrodes and the external electrodes to each other.

The first and second band portions 131b and 132b may be extended from the first and second connected portions 131a and 132a, respectively, to cover portions of at least the first surface 1 at the bottom of the capacitor body 110, which is a mounting surface of the capacitor body 110, or portions of at least one of the second surface 2, the fifth surface 5, and the sixth surface 6 of the capacitor body 110, and may serve to improve sticking strength of the first and second external electrodes 131 and 132.

Here, plating layers (not illustrated) may be formed on the first and second external electrodes 131 and 132.

The plating layers may include first and second nickel (Ni) plating layers each formed on the first and second external electrodes 131 and 132 and first and second tin (Sn) plating layers each formed on the first and second nickel plating layers, as an example.

The first metal frame 140 may include a first inner support portion, a first outer support portion disposed on an outer surface of the first inner support portion, and a first connecting portion 145 connecting at least portions of the first inner support portion and the first outer support portion to each other.

The first inner support portion may include a first inner vertical portion 142 and a first inner horizontal portion 144. The first connected portion 131a of the first external electrode 131 may be attached to an inner surface of the first inner vertical portion 142. The first inner horizontal portion 144 may be bent inwardly from a lower end of the first inner vertical portion 142 by 90°. Therefore, the first inner support portion may have a "⌊" shape.

The first outer support portion may include a first outer vertical portion 141 and a first outer horizontal portion 143. The first outer horizontal portion 143 may be bent inwardly from a lower end of the first outer vertical portion 141 by 90°, and an outer surface of the first outer horizontal portion 143 may become a mounting surface at the time of mounting the electronic component on a board. Therefore, the first outer support portion may have a "⌊" shape.

Here, surface treatment such as nickel/tin plating or nickel/gold plating may be performed on the first outer support portion so that a contact property between the first outer support portion and a solder at the time of mounting the electronic component on the board is further improved.

The first connecting portion 145 may be disposed to connect one ends of the first inner support portion and the first outer support portion relatively distant from the multilayer ceramic capacitor 101 to each other. Therefore, in the present exemplary embodiment, the first inner support portion and the first outer support portion may have the "⌊" shape, and the first connecting portion 145 may have a structure in which both ends thereof are connected to one end of the first inner horizontal portion 144 and one end of the first outer horizontal portion 143, respectively, to vertically connect the first inner horizontal portion 144 and the first outer horizontal portion 143 to each other.

According to the structure described above, in the present exemplary embodiment, the first metal frame 140 may generally have a "⌐" shape. In addition, the first metal frame 140 may have a state in which an upper end thereof is opened, when viewed from a I-I' cross section in FIG. 3.

Here, the first metal frame 140 may have a first space portion 146 provided between the first inner support portion and the first outer support portion disposed to be spaced apart from each other, and facing surfaces of the first inner support portion and the first outer support portion may be disposed to be closely adhered to each other, if necessary.

The second metal frame 150 may include a second inner support portion, a second outer support portion disposed on an outer surface of the second inner support portion, and a second connecting portion 155 connecting at least portions of the second inner support portion and the second outer support portion to each other.

The second inner support portion may include a second inner vertical portion 152 and a second inner horizontal portion 154. The second connected portion 132a of the second external electrode 132 may be attached to an inner surface of the second inner vertical portion 152. The second inner horizontal portion 154 may be bent from a lower end of the second inner vertical portion 152 by 90°. Therefore, the second inner support portion may have a "⌐" shape.

The second outer support portion may include a second outer vertical portion 151 and a second outer horizontal portion 153. The second outer horizontal portion 153 may be bent from a lower end of the second outer vertical portion 151 by 90°, and an outer surface of the second outer horizontal portion 153 may become a mounting surface at the time of mounting the electronic component on the board. Therefore, the second outer support portion may have a "⌐" shape.

Here, surface treatment such as nickel/tin plating or nickel/gold plating may be performed on the second outer support portion so that a contact property between the second outer support portion and a solder at the time of mounting the electronic component on the board is further improved.

The second connecting portion 155 may be disposed to connect one ends of the second inner support portion and the second outer support portion relatively distant from the multilayer ceramic capacitor 101 to each other. Therefore, in the present exemplary embodiment, the second inner support portion and the second outer support portion may have the "⌐" shape, and the second connecting portion 155 may have a structure in which both ends thereof are connected to one end of the second inner horizontal portion 154 and one end of the second outer horizontal portion 153, respectively, to vertically connect the second inner horizontal portion 154 and the second outer horizontal portion 153 to each other.

According to the structure described above, the first metal frame 150 may generally have a "⌐" shape. In addition, the second metal frame 150 may have a state in which an upper end thereof is opened, when viewed from a I-I' cross section in FIG. 3.

Here, the second metal frame 150 may have a second space portion 156 provided between the second inner support portion and the second outer support portion disposed to be spaced apart from each other, and facing surfaces of the second inner support portion and the second outer support portion may be disposed to be closely adhered to each other, if necessary.

In addition, a lower end of the multilayer ceramic capacitor 101 may be disposed to be spaced apart from lower ends of the first and second metal frames 140 and 150.

In addition, first and second conductive adhesive layers 161 and 162 may be disposed between the first and second external electrodes 131 and 132 and the first and second metal frames 140 and 150, respectively.

In the present exemplary embodiment, the first conductive adhesive layer 161 may be disposed between the first connected portion 131a of the first external electrode 131 and the inner surface of the first inner vertical portion 142 of the first inner support portion of the first metal frame 140.

In addition, the second conductive adhesive layer 162 may be disposed between the second connected portion 132a of the second external electrode 132 and the inner surface of the second inner vertical portion 152 of the second inner support portion of the second metal frame 150.

The first and second conductive adhesive layers 161 and 162 may be formed of, for example, a high melting-point solder or a conductive paste. However, materials of the first and second conductive adhesive layers 161 and 162 are not limited thereto.

In an L-shaped metal frame according to the related art, the multilayer ceramic capacitor, the metal frame, and the board are connected to one another in series, such that a deviation in warpage strength and acoustic noise may be generated depending on an amount or a shape of solders used as an adhesive.

For example, when an amount of the solders is increased or a wetting area of the solders is increased, coupling force between the multilayer ceramic capacitor and the metal frame and between the metal frame and the board may be increased, but stress and acoustic noise reducing effects may be decreased due to mechanical strength.

To the contrary, when an amount of the solders is decreased or a wetting area of the solders is decreased, the stress and acoustic noise reducing effects may be increased, but mechanical strength may be reduced, such that the metal frame may be separated from the board.

According to the present exemplary embodiment, vibrations of the multilayer ceramic capacitor may be uniformly absorbed in the space portions provided in the metal frames regardless of a bonded state between the multilayer ceramic capacitor and the metal frames and a bonded state between the board and the metal frames by the solders.

Therefore, the deviation generated in the structure of the metal frame according to the related art may not be generated, and stress and acoustic noise due to deformation may be more absorbed as compared to the structure according to the related art, such that warpage strength may be improved and the acoustic noise may be effectively reduced, regardless of the amount or the shape of the solders.

Method of Manufacturing an Exemplary Metal Frame (First Embodiment)

Figure 5:
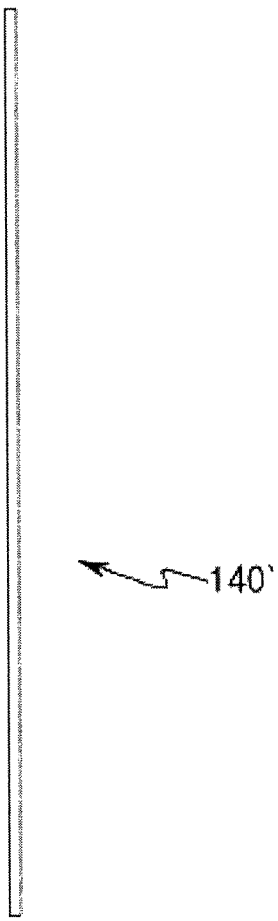
FIGS. 5, 6 and 7 show side views illustrating an example of a method of manufacturing a metal frame of the electronic component according to an exemplary embodiment in the present disclosure.
Figure 6:
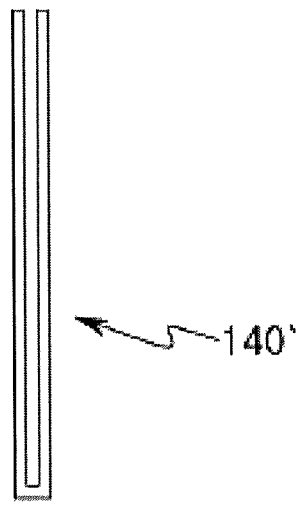
Figure 7:
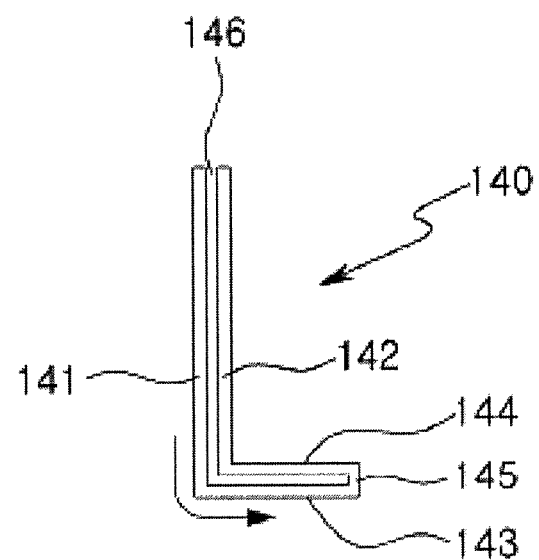

FIGS. 5, 6 and 7 show side views illustrating an example of a method of manufacturing a metal frame of the electronic component according to an exemplary embodiment in the present disclosure.

A method of manufacturing the first and second metal frames used in the electronic component according to the present exemplary embodiment will be described below.

FIGS. 5, 6 and 7 illustrate the first metal frame, but configurations of the first metal frame 140 and the second metal frame 150 are similar to each other except that the first metal frame 140 is connected to the first external electrode 121 and the second metal frame 150 is connected to the second external electrode 122. Therefore, the first metal frame 140 will hereinafter be mainly described, but such a description will be considered as including a description for the second metal frame 150.

Referring to FIG. 5, a sheet 140' having a flat surface and a linear shape may be first prepared.

Then, referring to FIG. 6, the sheet 140' may be folded in half. In this case, the sheet may be folded so that facing portions of the sheet folded in half are spaced apart from each other by a predetermined interval or are closely adhered to each other.

Then, as illustrated in FIG. 7, the sheet folded in half may be again folded in an "L" shape to prepare the first metal frame 140 having the first inner support portion, the first outer support portion, and the first connecting portion 145 according to the present exemplary embodiment.

Figure 10:
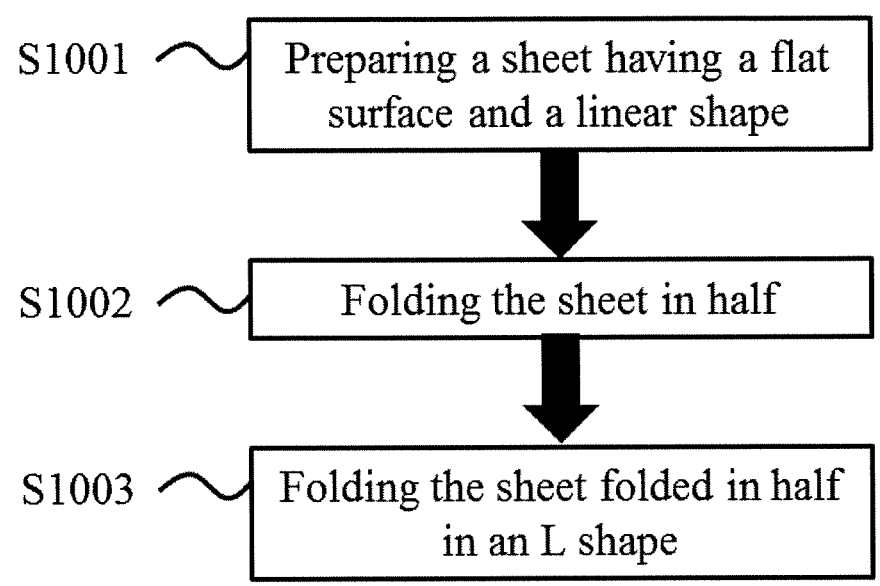
FIG. 10 shows a flowchart indicating the process flow of manufacturing a metal frame in FIGS. 5, 6, and 7 for the electronic component according to an exemplary embodiment in the present disclosure.

The above process is also shown in FIG. 10 which shows a flowchart indicating the manufacturing process steps to make the metal frame, i.e. the first metal frame 140 or the second metal frame 150. FIG. 10 shows that a sheet having a flat surface and a linear shape is prepared in step S1001, then the prepared sheet is folded in half in step S1002, and the sheet folded in half is further folded into an L shape to form the metal frame, first metal frame 140 or the second metal frame 150, to form the electronic component 100.

Board Having Electronic Component (First Embodiment)

Figure 8:
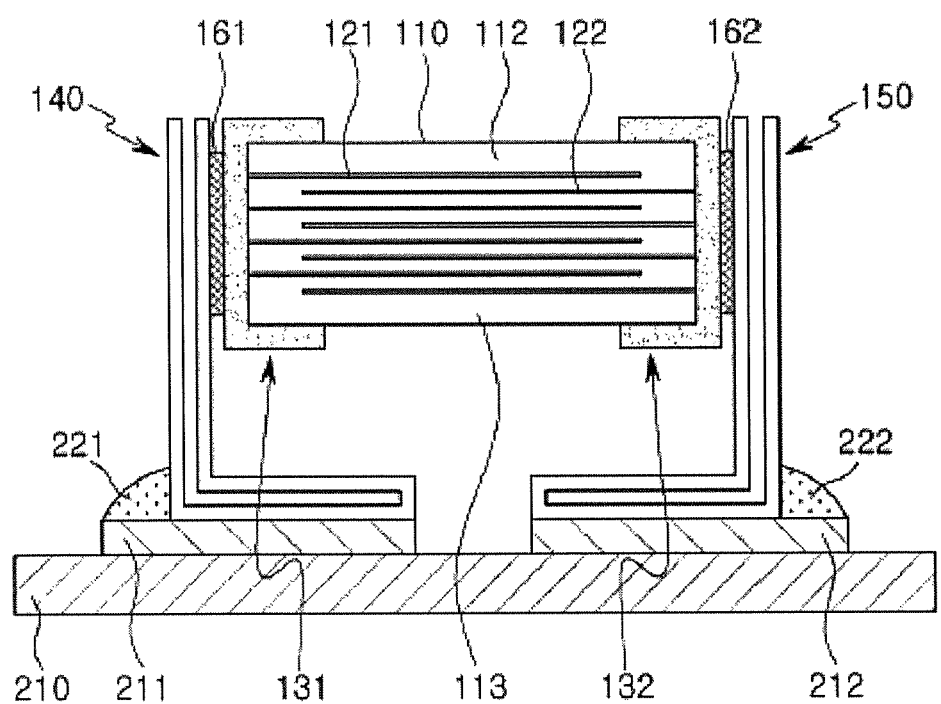
FIG. 8 shows a cross-sectional view illustrating a form in which the electronic component of FIG. 3 is mounted on a board.

Referring to FIG. 8, a board having an electronic component according to an exemplary embodiment in the present disclosure may include a circuit board 210 on which the electronic component 100 is mounted and first and second electrode pads 211 and 212 formed on an upper surface of the circuit board 210 to be spaced apart from each other.

Here, the electronic component 100 may be bonded and electrically connected to the circuit board 210 by solders 221 and 222 in a state in which lower surfaces of the first and second outer horizontal portions of the first and second outer support portions of the first and second metal frames 140 and 150 are positioned on the first and second electrode pads 211 and 212, respectively, to be in contact with the first and second electrode pads 211 and 212, respectively.

Here, the solders 221 and 222 may be formed only in the vicinity of lower ends of the outer surfaces of the first and second outer vertical portions 141 and 151 of the first and second outer support portions, respectively.

When voltages having different polarities are applied to the first and second external electrodes 131 and 132 formed on the third and fourth surfaces 3 and 4 of the capacitor body 110, respectively, in a state in which the electronic component including the multilayer ceramic capacitor 101 is mounted on the circuit board 210, the capacitor body 110 may be expanded and contracted in the Z direction due to an inverse piezoelectric effect of the dielectric layers 111, and the third and fourth surfaces 3 and 4 of the capacitor body 110 on which the first and second external electrodes 131 and 132 are formed, respectively, may be contracted and expanded as opposed to the expansion and the contraction of the capacitor body 110 in the Z direction due to a Poisson effect.

The abovementioned contraction and expansion may generate vibrations, which are transferred from the first and second external electrodes 131 and 132 to the circuit board 210. Therefore, sound may be radiated from the circuit board 210, which becomes the acoustic noise.

In the present exemplary embodiment, mechanical vibrations generated due to a piezoelectric property of the multilayer ceramic capacitor 101 may be partially absorbed by elastic force of the first and second metal frames 140 and 150, such that an amount of the vibrations transferred to the circuit board 210 may be reduced, resulting in a reduction in the acoustic noise.

In addition, the first and second metal frames 140 and 150 may absorb mechanical stress and external impact generated due to warpage, or the like, of the circuit board 210 to allow the stress not to be transferred to the multilayer ceramic capacitor 101, resulting in prevention of generation of a crack in the multilayer ceramic capacitor 101.

Figure 9:
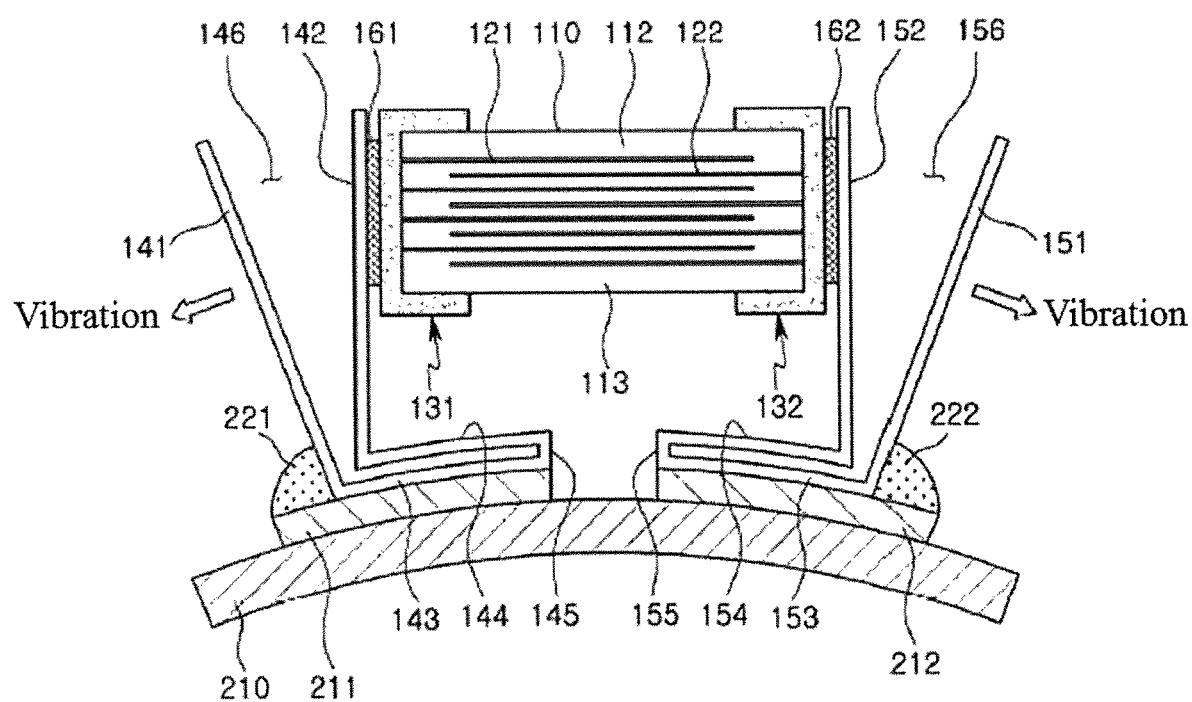
FIG. 9 shows a cross-sectional view for describing a phenomenon in which a circuit board of FIG. 8 is warped.

Referring to FIG. 9, when the circuit board is warped and deformed, the first and second metal frame may absorb mechanical stress of the circuit board while the first and second inner support portions of the first and second metal frames being maintained in a state in which they are attached to the first and second connected portions, respectively, and only the first and second outer vertical portions of the first and second metal frames being warped in a direction in which the circuit board is warped.

Therefore, in the present exemplary embodiment, vibrations may be effectively absorbed regardless of an amount or a wetting phenomenon of the solders to reduce the acoustic noise without a large deviation for each product.

Particularly, in a case in which the first inner support portion and the first outer support portion of the first metal frame have the "[" shape, end portions of horizontal portions of the first inner support portion and the first outer support portion are connected to each other, the second inner support portion and the second outer support portion of the second metal frame have the "]" shape, and end portions of horizontal portions of the second inner support portion and the second outer support portion are connected to each other as in the present exemplary embodiment, as illustrated in FIG. 9, a warpage crack may be more effectively prevented while only the first and second outer support portions being warped when warpage is generated in the circuit board.

Method of Manufacturing an Exemplary Metal Frame (Second Embodiment)

Figure 11:
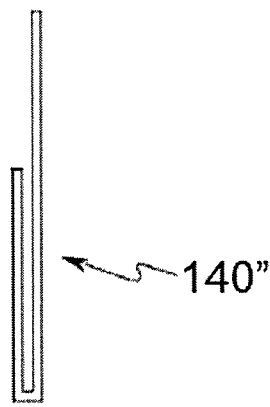
FIGS. 11, 12 and 13 show side views illustrating an example of a method of manufacturing a metal frame of the electronic component according to another exemplary embodiment in the present disclosure.
Figure 12:
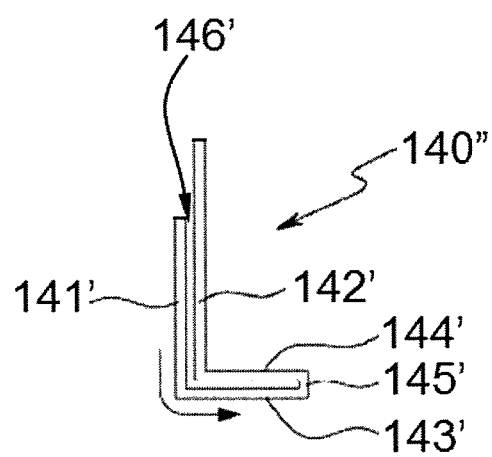
Figure 13:
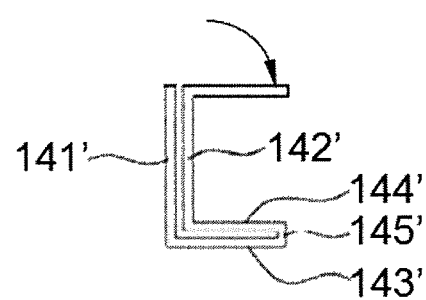

FIGS. 11, 12 and 13 show side views illustrating an example of a method of manufacturing a metal frame of the electronic component according to another exemplary embodiment in the present disclosure.

A method of manufacturing the first and second metal frames used in the electronic component according to the present exemplary embodiment will be described below.

FIGS. 11, 12 and 13 illustrate the first metal frame, but configurations of the first metal frame 140" and the second metal frame 150" are similar to each other except that the first metal frame 140" is connected to the first external electrode 121 and the second metal frame 150 is connected to the second external electrode 122. Therefore, the first metal frame 140" will hereinafter be mainly described, but such a description will be considered as including a description for the second metal frame 150".

Referring to FIG. 5, a sheet 140' having a flat surface and a linear shape may be first prepared.

Then, referring to FIG. 11, the sheet 140' may be folded to become the folded sheet 140". Then, as illustrated in FIG. 12, the folded sheet 140" may be again folded in an "L" shape, and FIG. 13 shows that a top portion of the folded sheet 140" is folded in an inverted "L" shape to prepare the first metal frame 140" having the first inner support portion, the first outer support portion, and the first connecting portion 145 according to the present exemplary embodiment.

Figure 15:
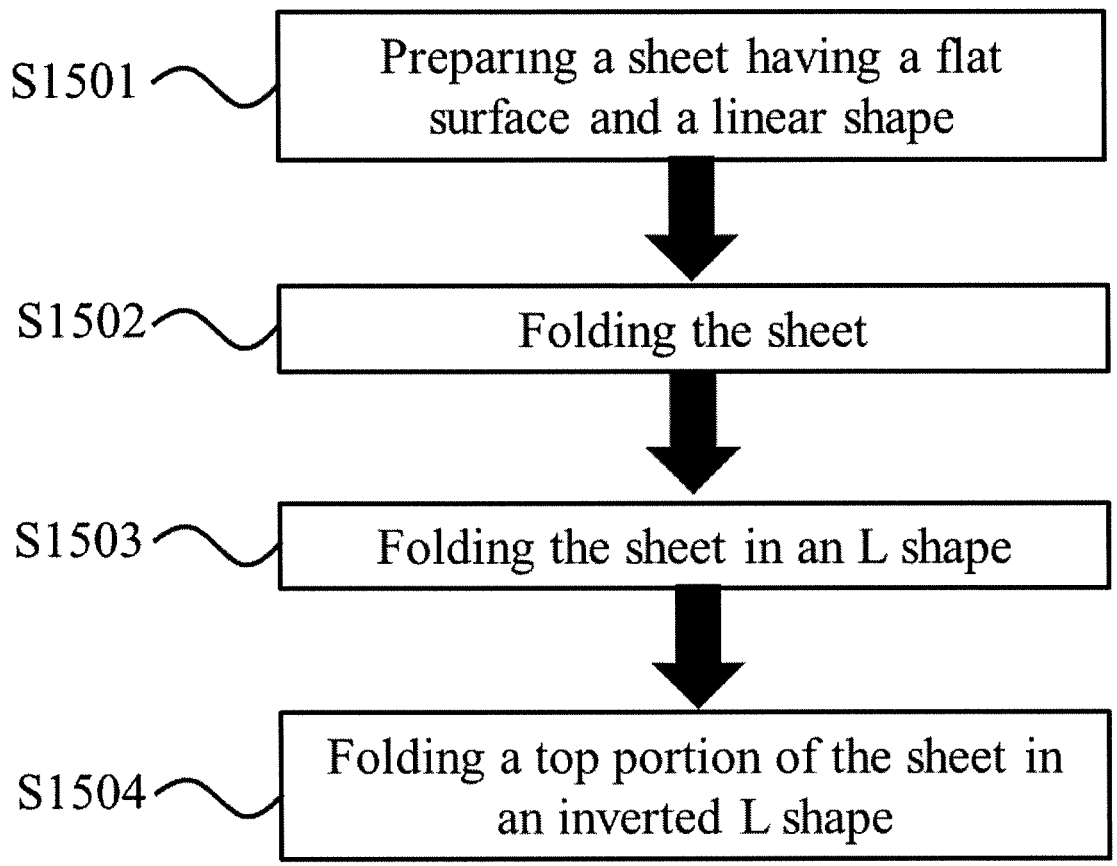
FIG. 15 shows a flowchart indicating the process flow of manufacturing a metal frame in FIGS. 11, 12, and 13 for the electronic component according to an exemplary embodiment in the present disclosure.

The above process is also shown in FIG. 15 which shows a flowchart indicating the manufacturing process steps to make the metal frame 140", i.e. the first metal frame 140" or the second metal frame 150". FIG. 15 shows that a sheet having a flat surface and a linear shape is prepared in step S1501, then the prepared sheet is folded in step S1502, and the folded sheet is further folded into an L shape (S1503) and a top portion of the folded sheet is folded into an inverted L shape (S1504) to form the metal frame, first metal frame 140" or the second metal frame 150", to form the electronic component 100".

Board Having Electronic Component (Second Embodiment)

Figure 14:
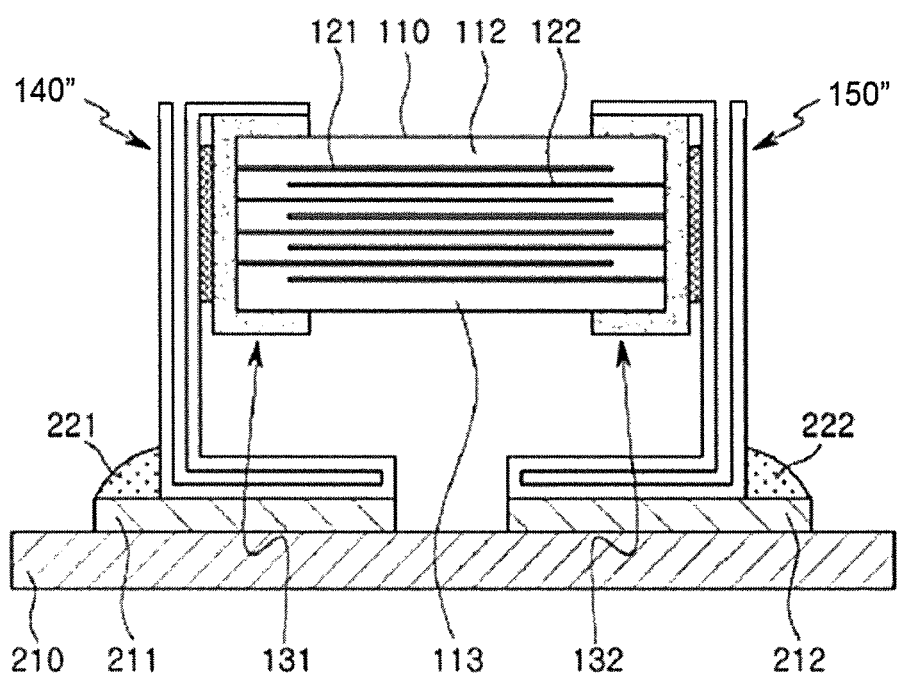
FIG. 14 shows a cross-sectional view illustrating a form in which the electronic component having a metal frame in FIG. 13 is mounted on a board.

Referring to FIG. 14, a board having an electronic component according to an exemplary embodiment in the present disclosure may include a circuit board 210 on which the electronic component 100" is mounted and first and second electrode pads 211 and 212 formed on an upper surface of the circuit board 210 to be spaced apart from each other.

Here, the electronic component 100" may be bonded and electrically connected to the circuit board 210 by solders 221 and 222 in a state in which lower surfaces of the first and second outer horizontal portions of the first and second outer support portions of the first and second metal frames 140" and 150" are positioned on the first and second electrode pads 211 and 212, respectively, to be in contact with the first and second electrode pads 211 and 212, respectively.

Here, the solders 221 and 222 may be formed only in the vicinity of lower ends of the outer surfaces of the first and second outer vertical portions 141 and 151 of the first and second outer support portions, respectively.

When voltages having different polarities are applied to the first and second external electrodes 131 and 132 formed on the third and fourth surfaces 3 and 4 of the capacitor body 110, respectively, in a state in which the electronic component including the multilayer ceramic capacitor 101 is mounted on the circuit board 210, the capacitor body 110 may be expanded and contracted in the Z direction due to an inverse piezoelectric effect of the dielectric layers 111, and the third and fourth surfaces 3 and 4 of the capacitor body 110 on which the first and second external electrodes 131 and 132 are formed, respectively, may be contracted and expanded as opposed to the expansion and the contraction of the capacitor body 110 in the Z direction due to a Poisson effect.

The abovementioned contraction and expansion may generate vibrations, which are transferred from the first and second external electrodes 131 and 132 to the circuit board 210. Therefore, sound may be radiated from the circuit board 210, which becomes the acoustic noise.

In the present exemplary embodiment, mechanical vibrations generated due to a piezoelectric property of the multilayer ceramic capacitor 101 may be partially absorbed by elastic force of the first and second metal frames 140" and 150", such that an amount of the vibrations transferred to the circuit board 210 may be reduced, resulting in a reduction in the acoustic noise.

In addition, the first and second metal frames 140" and 150" may absorb mechanical stress and external impact generated due to warpage, or the like, of the circuit board 210 to allow the stress not to be transferred to the multilayer ceramic capacitor 101, resulting in prevention of generation of a crack in the multilayer ceramic capacitor 101.

As set forth above, according to the exemplary embodiments in the present disclosure, the acoustic noise and warpage reducing effects may be improved by the metal frame including the inner support portion, the outer support portion, and the connecting portion.

While exemplary embodiments have been shown and described, it will be apparent to those skilled in the art that modifications and variations could be made without departing from the scope of the present invention as defined by the appended claims.

What is claimed is:

1. An electronic component comprising: a multilayer ceramic capacitor including a plurality of external electrodes formed on opposing surfaces of a capacitor body, respectively; and metal frames bonded to corresponding surfaces of the external electrodes, respectively, wherein each of the metal frames includes: an inner support portion, an outer support portion disposed on an outer surface of the inner support portion, and a connecting portion connecting portions of the inner support portion and the outer support portion to each other, wherein the connecting portion is the only portion connecting the inner support portion and the outer support portion, wherein the connecting portion is arranged entirely inwardly of the corresponding surface of the external electrode when viewing the electronic component in cross-section, and wherein the inner support portion and the outer support portion have an L shape.

2. The electronic component of claim 1, wherein in the metal frame, the connecting portion is disposed to connect one ends of the inner support portion and the outer support portion relatively distant from the multilayer ceramic capacitor to each other.

3. The electronic component of claim 1, wherein in the metal frame, the inner support portion and the outer support portion are disposed to be spaced apart from each other.

4. The electronic component of claim 1, wherein in the metal frame, the inner support portion and the outer support portion are disposed to be closely adhered to each other.

5. The electronic component of claim 1, wherein the metal frame has an "L" shape.

6. The electronic component of claim 1, wherein an end portion of a horizontal portion of the inner support portion and an end portion of a horizontal portion of the outer support portion are vertically connected to both ends of the connecting portion, respectively.

7. The electronic component of claim 5, wherein in the metal frame, an inner surface of an upper portion of the inner support portion is attached to the external electrode, and an outer surface of a lower portion of the outer support portion is a mounting surface.

8. The electronic component of claim 1, wherein a lower end of the multilayer ceramic capacitor is disposed to be spaced apart from a lower end of the metal frame.

9. The electronic component of claim 1, further comprising conductive adhesive layers disposed between the external electrodes and the metal frames.

10. The electronic component of claim 1, wherein the multilayer ceramic capacitor includes dielectric layers and a plurality of internal electrodes alternately disposed with respective dielectric layers interposed therebetween.

11. A board having an electronic component, comprising:
a circuit board having a plurality of electrode pads disposed thereon; and
the electronic component of claim 1 mounted on the circuit board so that the metal frames are bonded to the electrode pads, respectively.

12. The electronic component of claim 1, wherein the capacitor body has a hexahedral shape.

13. An electronic component comprising: a multilayer ceramic capacitor including a plurality of external electrodes formed on opposing surfaces of a capacitor body, respectively; and metal frames bonded to corresponding surfaces of the external electrodes, respectively, wherein each of the metal frames includes: an inner support portion, an outer support portion separated from and overlapping an outer surface of the inner support portion, a connecting portion connecting the inner support portion and the outer support portion, wherein the connecting portion is the only portion connecting the inner support portion and the outer support portion, wherein the connecting portion is arranged entirely inwardly of the corresponding surface of the external electrode when viewing the electronic component in cross-section, and the inner support portion and the outer support portion have an L shape.

14. The electronic component of claim 13, wherein the metal frame has a "L" shape.

15. The electronic component of claim 13, wherein an end portion of a horizontal portion of the inner support portion and an end portion of a horizontal portion of the outer support portion are vertically connected to both ends of the connecting portion, respectively.

16. A board having an electronic component, comprising:
   a circuit board having a plurality of electrode pads disposed thereon; and
   the electronic component of claim 13 mounted on the circuit board so that the metal frames are bonded to the electrode pads, respectively.

\* \* \* \* \*